(12) United States Patent
Oh et al.

(10) Patent No.: US 11,627,660 B2
(45) Date of Patent: Apr. 11, 2023

(54) FLEXIBLE CIRCUIT BOARD AND DISPLAY APPARATUS INCLUDING IHE SAME

(71) Applicant: Samsung Display Co., Ltd., Yongin-si (KR)

(72) Inventors: Myong-Soo Oh, Asan-si (KR); Doosan Park, Asan-si (KR); Hyunchul Jin, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 3 days.

(21) Appl. No.: 17/146,291

(22) Filed: Jan. 11, 2021

(65) Prior Publication Data

US 2021/0307171 A1    Sep. 30, 2021

(30) Foreign Application Priority Data

Mar. 31, 2020    (KR) .......................... 10-2020-0039078

(51) Int. Cl.
*H05K 1/18*    (2006.01)
*H05K 1/14*    (2006.01)

(52) U.S. Cl.
CPC ... *H05K 1/147* (2013.01); *H05K 2201/10128* (2013.01); *H05K 2201/2081* (2013.01)

(58) Field of Classification Search
CPC ......... H05K 1/147; H05K 2201/10128; H05K 2201/2081
USPC .......................................................... 361/749
See application file for complete search history.

(56) References Cited

U.S. PATENT DOCUMENTS

| | | | |
|---|---|---|---|
| 5,303,122 A * | 4/1994 | Adams, Jr. ............. | H05K 1/111 361/767 |
| 8,105,934 B2 | 1/2012 | Kwon et al. | |
| 9,113,563 B2 | 8/2015 | Kim et al. | |
| 9,775,248 B2 | 9/2017 | Kim | |
| 2008/0119061 A1 | 5/2008 | Hwang et al. | |
| 2011/0199569 A1* | 8/2011 | Matsui ................... | H05K 1/117 257/770 |
| 2014/0043577 A1* | 2/2014 | Kim ........................ | H05K 1/11 174/254 |

(Continued)

FOREIGN PATENT DOCUMENTS

| | | | | |
|---|---|---|---|---|
| JP | 2003060051 | | 2/2003 | |
| JP | 2003060051 A * | | 2/2003 | ............. H01L 24/06 |

(Continued)

OTHER PUBLICATIONS

Extended European Search Report dated Aug. 18, 2021, issued in European Patent Application No. 21166106.1.

*Primary Examiner* — Binh B Tran
(74) *Attorney, Agent, or Firm* — H.C. Park & Associates, PLC

(57) ABSTRACT

A display apparatus, includes: a flexible circuit board including a first board pad and a second board pad, which are spaced apart from each other in a first direction and extend in a second direction intersecting the first direction; a main circuit board coupled to the flexible circuit board; and a display panel coupled to the flexible circuit board, the display panel including a first display pad overlapped with the first board pad and a second display pad overlapped with the second board pad, wherein the first board pad includes a first, second, and third portions, and the second board pad includes a first, second, and third portions.

19 Claims, 13 Drawing Sheets

(56) References Cited

U.S. PATENT DOCUMENTS

| | | | |
|---|---|---|---|
| 2016/0050745 A1* | 2/2016 | Liu | H05K 3/323 361/749 |
| 2019/0067406 A1* | 2/2019 | Lee | H05K 1/147 |
| 2020/0077518 A1 | 3/2020 | Kim et al. | |

FOREIGN PATENT DOCUMENTS

| | | |
|---|---|---|
| JP | 4651367 | 3/2011 |
| KR | 10-0632472 | 10/2006 |
| KR | 10-0881183 | 2/2009 |
| KR | 10-2016-0101823 | 8/2016 |
| KR | 10-2018-0001978 | 1/2018 |
| KR | 10-1891989 | 10/2018 |

* cited by examiner

FLEXIBLE CIRCUIT BOARD AND DISPLAY APPARATUS INCLUDING THE SAME

CROSS-REFERENCE TO RELATED APPLICATION

This application claims priority from and the benefit of Korean Patent Application No. 10-2020-0039078, filed on Mar. 31, 2020, which is hereby incorporated by reference for all purposes as if fully set forth herein.

BACKGROUND

Field

The invention relates to generally to display device and, more particularly, to a flexible circuit board and a display apparatus including the same.

Discussion of the Background

A display apparatus is fabricated by manufacturing a display panel and connecting a circuit board to the display panel. For example, in a tape-automated-bonding (TAB) mounting method, a flexible circuit board is bonded to the display panel using an anisotropic conductive film (ACF).

The above information disclosed in this Background section is only for understanding of the background of the inventive concepts, and, therefore, it may contain information that does not constitute prior art.

SUMMARY

Applicant realized that display devices may fail due to the bonding of flexible circuit boards to a display panel using an anisotropic conductive film. For example, the anisotropic conductive film may suffer from various issues (e.g., a restricted flow causing a lump and a consequent short-circuit issue), which may occur between adjacent ones of the pads being connected to each other in a pressing process, depending on the thickness of the pads being connected.

Display apparatuses constructed according to the principles and exemplary implementations of the invention can prevent a flexible circuit board from failing in the anisotropic conductive film bonding process, thereby improving reliability. For example, if adjacent board pads of a flexible circuit board are spaced at a substantially uniform distance from each other, it may be possible to facilitate flowability of and prevent or suppress the anisotropic conductive film from being lumped in a region between the pads during a pressing process to connect the flexible circuit board pads and the display pads of a display panel. Accordingly, the connection characteristics between the flexible circuit board and the display panel may be improved, and the display apparatus has improved reliability.

Additional features of the inventive concepts will be set forth in the description which follows, and in part will be apparent from the description, or may be learned by practice of the inventive concepts.

According to one aspect of the invention, a display apparatus, includes: a flexible circuit board including a first board pad and a second board pad, which are spaced apart from each other in a first direction and extend in a second direction intersecting the first direction; a main circuit board coupled to the flexible circuit board; and a display panel coupled to the flexible circuit board, the display panel including a first display pad overlapped with the first board pad and a second display pad overlapped with the second board pad, wherein the first board pad includes a first portion, a second portion, and a third portion, with the third portion being disposed between the first and second portions, the second board pad includes a first portion, a second portion, and a third portion, with the third portion being disposed between the first and the second portions, the third portion of the first board pad having a width in the first direction that increases with increasing distance in the second direction, and the third portion of the second board pad having a width in the first direction that decreases with increasing distance in the second direction.

The first portion, the second portion, and the third portion of the first board pad arranged in an order reversed from an arrangement order of the first portion, the second portion, and the third portion of the second board pad, when viewed in the second direction.

The first portion of the first board pad may have a width in the first direction larger than a width of the second portion of the first board pad, and the first portion of the second board pad may have a width in the first direction larger than a width of the second portion of the second board pad.

A distance between the first portion of the first board pad and the second portion of the second board pad, a distance between the third portion of the first board pad and the third portion of the second board pad, and a distance between the second portion of the first board pad and the first portion of the second board pad may be substantially the same.

The first portion of the first board pad and a first pad portion of the second board pad may have substantially the same shape, the first varying portion and the second varying portion may have substantially the same shape, and the second portion of the first board pad and the second portion of the second board pad may have substantially the same shape.

The first varying portion may have a generally convex shape, and the second varying portion may have a generally concave shape.

The second board pad further may have an additional varying portion, which may be spaced apart from the second varying portion with the first portion of the second board pad interposed therebetween.

Each of the third portions may have a width in the second direction ranging from about 50 μm to about 500 μm.

The flexible circuit board may include an insulating layer, a plurality of board signal lines disposed on the insulating layer, and a solder resist layer, in which openings partially exposing the board signal lines may be defined, the second portion of the first board pad may extend from a corresponding one of the board signal lines, and the first portion of the second board pad may extend from a corresponding another one of the board signal lines.

The first board pad and the second board pad may be coupled to the first display pad and the second display pad by an anisotropic conductive film.

The first board pad may have a thickness in a thickness direction of the display panel larger than a thickness of the first display pad, and the second board pad may have a thickness of in the thickness direction of the display panel larger than a thickness of the second display pad.

According to another aspect of the invention, a flexible circuit board for a display apparatus includes: a first board pad and a second board pad, which are spaced apart from each other in a first direction to be and are extended in a second direction intersecting the first direction, wherein the first board pad includes a first pad portion, a first extended portion, and a first varying portion disposed between the first pad portion and the first extended portion, the second board pad includes a second pad portion, a second extended portion, and a second varying portion disposed between the second pad portion and the second extended portion, and the first pad portion, the first varying portion, and the first extended portion are disposed in an order reversed from an arrangement order of the second pad portion, the second varying portion, and the second extended portion, when viewed in the second direction.

A distance between the first pad portion and the second extended portion, a distance between the first varying portion and the second varying portion, and a distance between the first extended portion and the second pad portion may be substantially the same.

The first pad portion may have a width in the first direction larger than a width of the first extended portion, and the second pad portion may have a width in the first direction larger than a width of the second extended portion.

The first varying portion may have a width of in the first direction that may increase with increasing distance in the second direction, and the second varying portion may have a width in the first direction that may decrease with increasing distance in the second direction.

The first pad portion and the second pad portion may have substantially the same shape, the first varying portion and the second varying portion may have substantially the same shape, and the first extended portion and the second extended portion may have substantially the same shape.

The first varying portion may have a generally convex shape, and the second varying portion may have a generally concave shape.

The second board pad may further include an additional varying portion, which may be spaced apart from the second varying portion with the second pad portion interposed therebetween.

Each of the first and second varying portions may have a width in the second direction ranging from about 50 μm to about 500 μm.

The flexible circuit board may include an insulating layer, a plurality of board signal lines disposed on the insulating layer, and a solder resist layer, in which openings partially exposing the board signal lines may be defined, and the first board pad and the second board pad may be coupled to corresponding ones of the board signal lines through the openings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
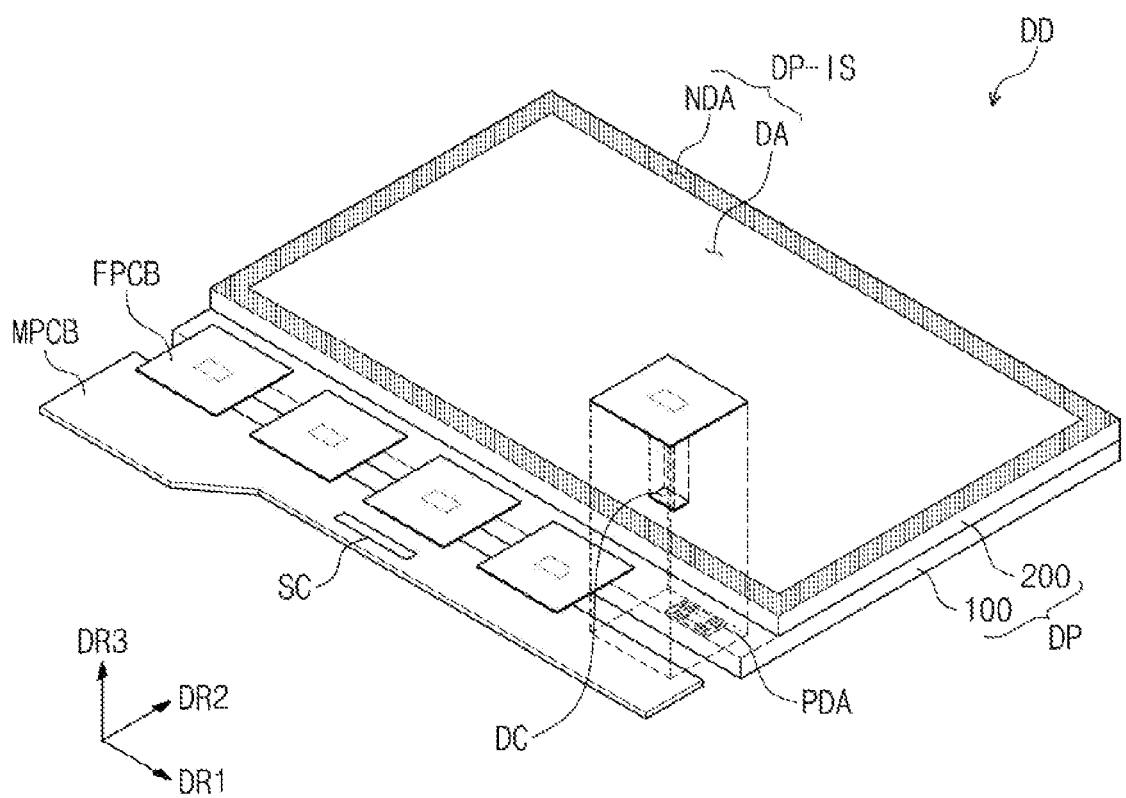
FIG. 1 is a perspective view illustrating an exemplary embodiment of a display apparatus constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, molecules, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2A:
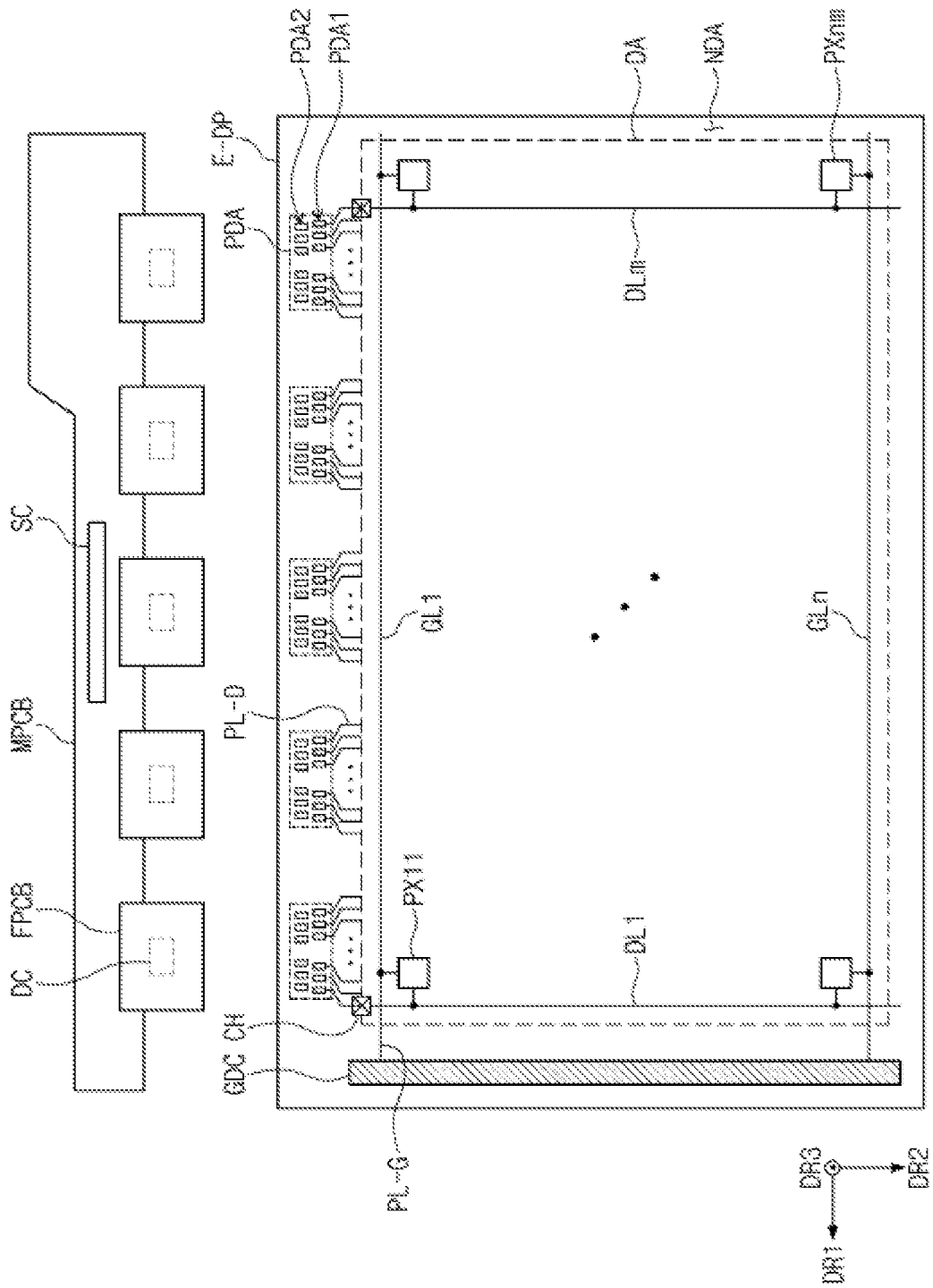
FIG. 2A is a plan view illustrating an exemplary embodiment of a display apparatus of FIG. 1.
Figure 2B:
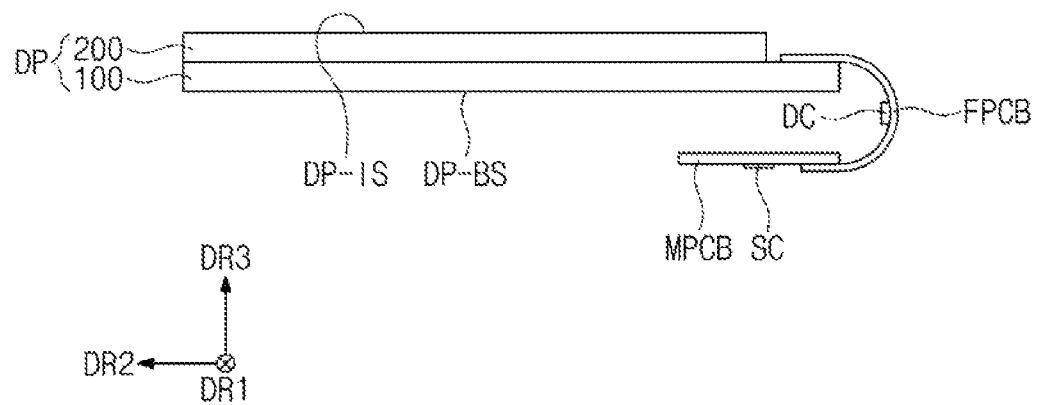
FIG. 2B is a cross-sectional view illustrating an exemplary embodiment of the display apparatus of FIG. 1.
Figure 3A:
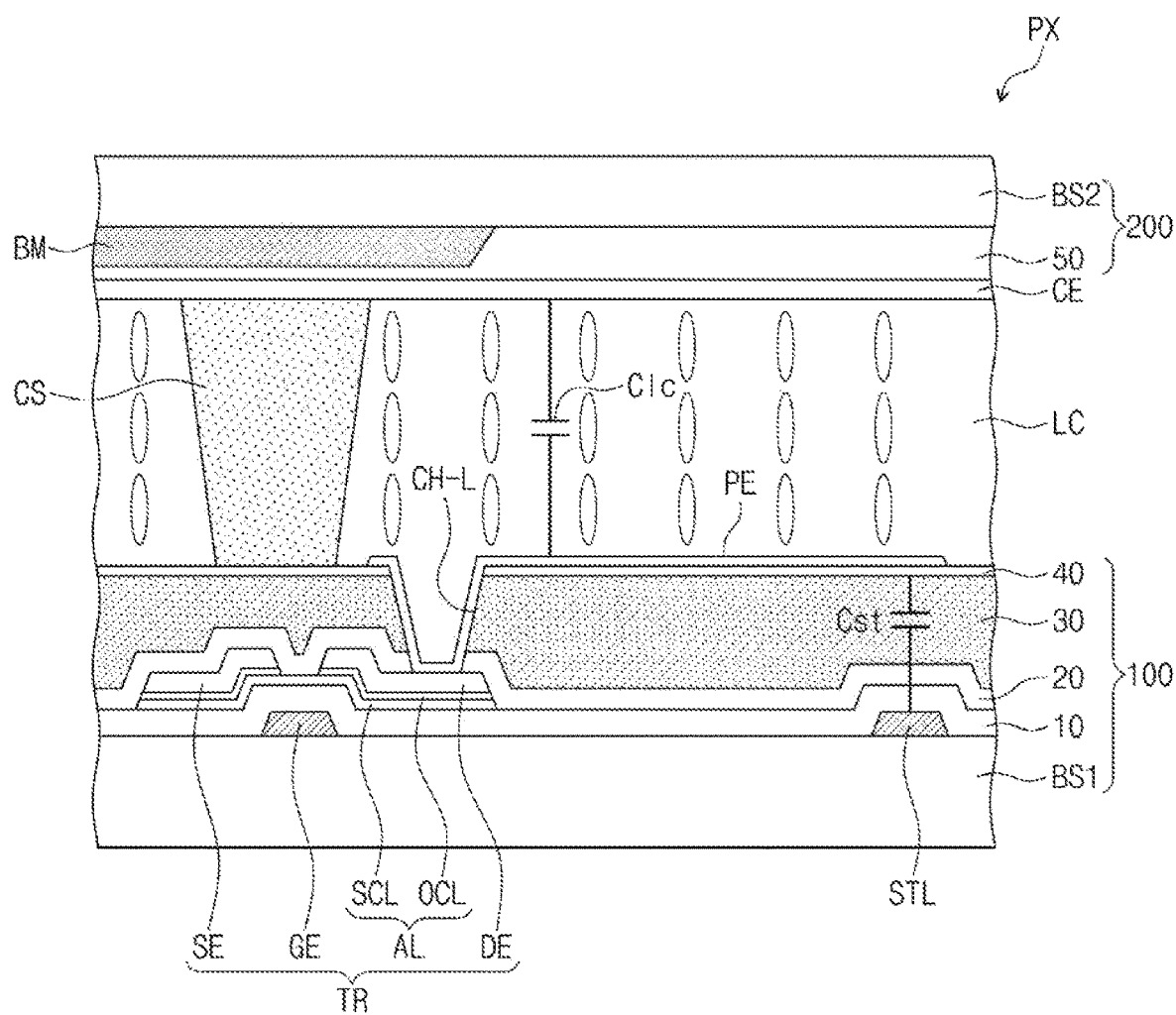
FIG. 3A is a cross-sectional view illustrating an exemplary embodiment of a display region of the display panel of FIG. 1.
Figure 3B:
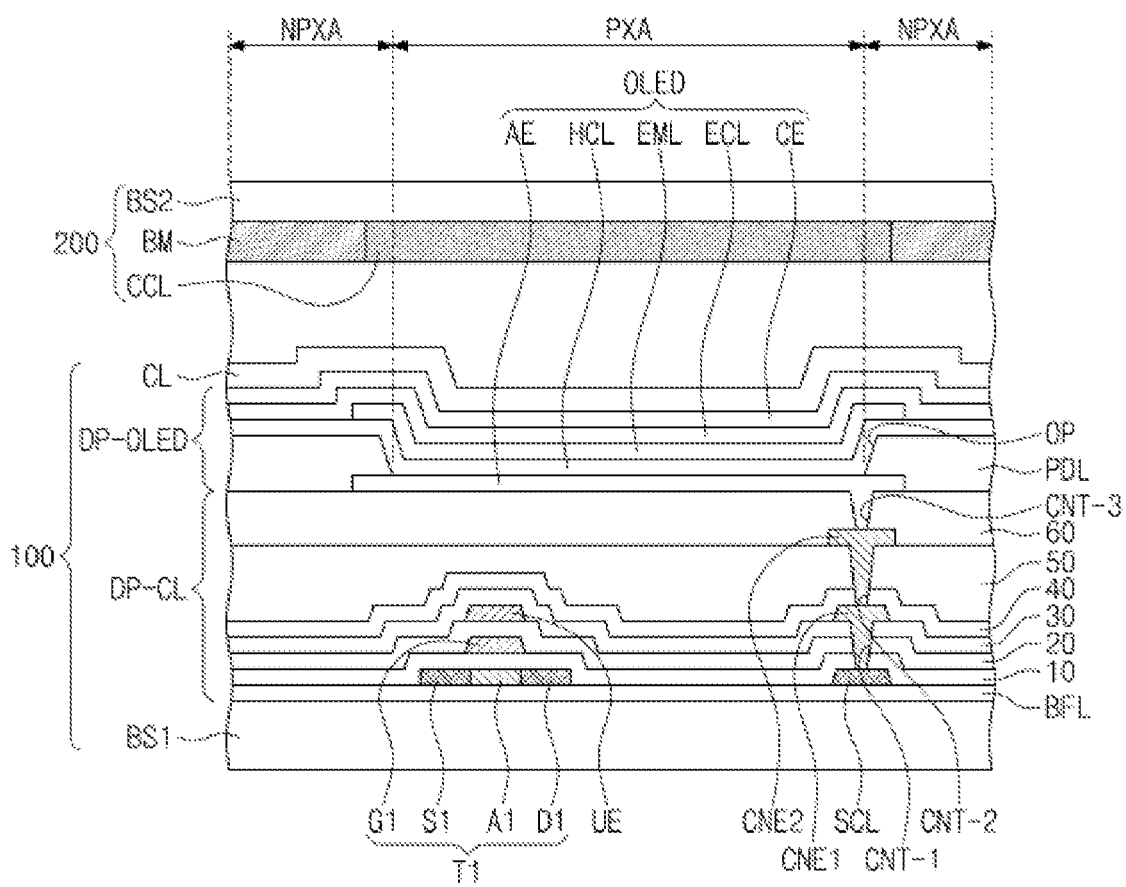
FIG. 3B is a cross-sectional view illustrating an exemplary embodiment of a display region of the display panel of FIG. 1.

FIG. 1 is a perspective view illustrating an exemplary embodiment of a display apparatus constructed according to principles of the invention. FIG. 2A is a plan view illustrating an exemplary embodiment of a display apparatus of FIG. 1. FIG. 2B is a cross-sectional view illustrating an exemplary embodiment of the display apparatus of FIG. 1. FIG. 3A is a cross-sectional view illustrating an exemplary embodiment of a display region of the display panel of FIG. 1. FIG. 3B is a cross-sectional view illustrating an exemplary embodiment of a display region of the display panel of FIG. 1.

Referring to FIGS. 1, 2A to 2B, a display apparatus DD may include a display panel DP, a flexible circuit board FPCB, and a main circuit board MPCB. The display panel DP may be one of a liquid crystal display panel, a plasma display panel, an electrophoretic display panel, a microelectromechanical system (MEMS) display panel, an electrowetting display panel, and an organic light emitting display panel, or other known display panel. In the case where the display panel DP is a liquid crystal display panel, the display apparatus DD may further include a backlight unit disposed below the display panel DP.

The display panel DP may include a first display substrate 100 and a second display substrate 200. The second display substrate 200 may be provided to face the first display substrate 100. A graduated display layer, which is used to display the image, may be disposed between the first display substrate 100 and the second display substrate 200. The graduated display layer may include a liquid crystal layer, an organic emission layer, and an electrophoretic layer, depending on the kind of the display panel.

The display apparatus DD may further include a window covering the display panel DP and a chassis or molding member, which is combined with the window to define an outer appearance of the display apparatus DD.

As shown in FIG. 1, the display panel DP may include a display surface DP-IS, which is used to display an image. The display surface DP-IS may be generally parallel to a plane defined by a first direction axis DR1 and a second direction axis DR2. The display surface DP-IS may include a display region DA and a non-display region NDA. The non-display region NDA may be defined along an edge of the display surface DP-IS. The display region DA may be enclosed by the non-display region NDA. However, the exemplary embodiments are not limited to this example, and in an exemplary embodiment, the non-display region NDA may be locally disposed near one side portion of the flexible circuit board FPCB.

A direction normal to the display surface DP-IS (i.e., the thickness direction of the display panel DP) will be referred to as the third direction axis DR3. A front or top surface and a rear or bottom surface of each member to be described below may be distinguished, based on the third direction axis DR3. However, the first to third direction axes DR1, DR2, and DR3 illustrated in some exemplary embodiments are just an example. Hereinafter, first to third directions may be directions indicated by the first to third direction axes DR1, DR2, and DR3, respectively, and will be identified with the same reference numbers.

In some exemplary embodiments, the display surface DP-IS of the display panel DP is illustrated to be of a generally flat type, but the exemplary embodiments are not limited to this example. The display surface DP-IS of the display apparatus DD may have a generally curved or three-dimensional shape. The three-dimensional display surface may include a plurality of display regions, which are oriented in different directions.

A signal control unit SC may be mounted on the main circuit board MPCB. The signal control unit SC may receive image data and control signals from an external graphic control unit. The signal control unit SC may provide the control signals to the display panel DP.

The flexible circuit board FPCB may be respectively coupled to a display pad region PDA of the display panel DP and a main pad region of the main circuit board MPCB by a conductive adhesive member. The conductive adhesive member may include an anisotropic conductive film (ACF). The description that follows will refer to an example in which the conductive adhesive member is the anisotropic conductive film ACF.

In some exemplary embodiments, a plurality of the flexible circuit boards FPCB may be provided. For example, the flexible circuit boards may be spaced apart from each other in the first direction DR1. However, the exemplary embodiments are not limited to this example, and the flexible circuit board FPCB may include two types of flexible circuit boards, which are at least partially overlapped with each other.

In some exemplary embodiments, the display pad region PDA is illustrated to be disposed on the first display substrate 100, but the exemplary embodiments are not limited to this example. In some exemplary embodiments, the display pad region PDA may be disposed on the second display substrate 200.

The flexible circuit board FPCB may include a driving chip DC. The flexible circuit board FPCB may transmit signals from the main circuit board MPCB to the driving chip DC and may transmit signals from the driving chip DC to the display panel DP. In some exemplary embodiments, each of the driving chips DC may be a data driving circuit. In some exemplary embodiments, the flexible circuit board FPCB may transmit signals, which are provided from the signal control unit SC, to the display panel DP.

FIG. 2A illustrates an example of a planar arrangement of signal lines GL1 to GLn, DL1 to DLm, PL-G, and PL-D and pixels PX11 to PXnm. The signal lines GL1 to GLn, DL1 to DLm, PL-G, and PL-D may include a plurality of gate lines GL1 to GLn, a plurality of data lines DL1 to DLm, and auxiliary signal lines PL-G and PL-D.

The gate lines GL1 to GLn may be extended in the first direction DR1 and may be arranged in the second direction DR2, and the data lines DL1 to DLm may be disposed across the gate lines GL1 to GLn and may be electrically disconnected from the gate lines GL1 to GLn. The gate lines GL1 to GLn and the data lines DL1 to DLm may be overlapped with the display region DA. The auxiliary signal lines PL-G and PL-D may be overlapped with the non-display region NDA, and the auxiliary signal lines PL-G and PL-D may be connected to corresponding ones of the gate lines GL1 to GLn and the data lines DL1 to DLm.

The second auxiliary signal lines PL-D connected to the data lines DL1 to DLm may be disposed on a layer that is different from that under the data lines DL1 to DLm. The data lines DL1 to DLm may be electrically connected to corresponding ones of the second auxiliary signal lines PL-D through contact holes CH. The contact hole CH may penetrate at least one insulating layer provided between the data lines DL1 to DLm and the second auxiliary signal lines PL-D. FIG. 2A illustrates an example in which a pair of the contact holes CH are provided.

In some exemplary embodiments, the contact hole CH may be omitted. The data lines DL1 to DLm and the second auxiliary signal lines PL-D may be disposed on the same layer. Here, one of the data lines DL1 to DLm and one of the second auxiliary signal lines PL-D connected thereto may be defined as a single signal line. Here, the data line and the second auxiliary signal line, which are connected to each other, may be defined as two different portions of the single signal line.

The pixels PX11 to PXnm may be disposed in the display region DA. The pixels PX11 to PXnm may not be disposed in the non-display region NDA. Each of the pixels PX11 to PXnm may be connected to a corresponding one of the gate lines GL1 to GLn and a corresponding one of the data lines DL1 to DLm. Each of the pixels PX11 to PXnm may include a pixel driving circuit and a display device.

FIG. 2A illustrates an example in which the pixels PX11 to PXnm are arranged in a generally matrix shape, but the exemplary embodiments are not limited to this example. For example, the pixels PX11 to PXnm may be arranged in a generally diamond shape, and in this case, the arrangement structure of the pixels PX11 to PXnm may be defined as a pentile structure.

Two pad rows PDA1 and PDA2 may be disposed in the display pad region PDA. Each of the two pad rows PDA1 and PDA2 may include a plurality of display pads that are arranged in the first direction DR1. The first display pad row PDA1 may be spaced apart from the second display pad row PDA2 in the second direction DR2 intersecting the first direction DR1.

In the second direction DR2, the first display pad row PDA1 may be farther from an edge E-DP of the display panel DP than the second display pad row PDA2 and may be closer to the display region DA than the second display pad row PDA2. First display pads in the first display pad row PDA1 and second display pads in the second display pad row PDA2 may be alternately disposed. The display pads of the first and second display pad rows PDA1 and PDA2 may be respectively connected to corresponding ones of the second auxiliary signal lines PL-D.

A gate driving circuit GDC may be integrated on the display panel DP by an oxide silicon gate (OSG) driver circuit process or an amorphous silicon gate (ASG) driver circuit process. The first auxiliary signal lines PL-G may receive gate signals from the gate driving circuit GDC.

Referring to FIG. 2B, the flexible circuit board FPCB according to some exemplary embodiments may be bent with a specific curvature to face a rear surface DP-BS of the display panel DP. Here, the main circuit board MPCB may be placed to face the rear surface DP-BS of the display panel DP.

FIGS. 3A and 3B are cross-sectional views illustrating the display region DA of the display panel DP according to some exemplary embodiments. FIG. 3A illustrates a cross-section corresponding to a representative pixel PX of a liquid crystal display panel, and FIG. 3B illustrates a cross-section corresponding to the pixel PX of an organic light emitting display panel.

Referring to FIG. 3A, the graduated display layer of the display panel DP according to some exemplary embodiments may include a liquid crystal layer. That is, the display panel DP may be a liquid crystal display panel. In this case, the display apparatus DD may further include a backlight unit disposed below the display panel DP.

The pixel PX of the liquid crystal display panel may include a transistor TR, a liquid crystal capacitor Clc, and a storage capacitor Cst. The transistor TR may include a control electrode GE connected to the gate line, an active portion AL overlapped with the control electrode GE, an input electrode SE connected to the data line, and an output electrode DE spaced apart from the input electrode SE. The liquid crystal LC may include the liquid crystal capacitor Clc, which may include a pixel electrode PE and a common electrode CE. The storage capacitor Cst may include the pixel electrode PE and a portion of a storage line STL, which is overlapped with the pixel electrode PE.

The control electrode GE and the storage line STL may be disposed on a surface of a first base substrate BS1. The first base substrate BS1 may be one of a glass substrate, a plastic substrate, and a substrate including a polyimide (PI). A first insulating layer 10 may be disposed on the surface of the first base substrate BS1 to cover the control electrode GE and the storage line STL. The first insulating layer 10 may be formed of or include at least one of inorganic or organic materials.

The active portion AL may be disposed on the first insulating layer 10 to be overlapped with the control electrode GE. The active portion AL may include a semiconductor layer SCL and an ohmic contact layer OCL. The semiconductor layer SCL may be disposed on the first insulating layer 10, and the ohmic contact layer OCL may be disposed on the semiconductor layer SCL.

The semiconductor layer SCL may be formed of or include an amorphous silicon or poly silicon. In some exemplary embodiments, the semiconductor layer SCL may be formed of or include at least one of metal oxide semiconductor materials. The ohmic contact layer OCL may include dopants whose doping concentration is higher than that of the semiconductor layer. The ohmic contact layer OCL may include two portions spaced apart from each other. In some exemplary embodiments, the ohmic contact layer OCL may be provided as a single object.

The output electrode DE and the input electrode SE may be disposed on the active portion AL. The output electrode DE and the input electrode SE may be spaced apart from each other. A second insulating layer 20 may be formed on the first insulating layer 10 to cover the active portion AL, the output electrode DE, and the input electrode SE. A third insulating layer 30 may be disposed on the second insulating layer 20. The second insulating layer 20 and the third insulating layer 30 may be formed of or include at least one of inorganic or organic materials. The third insulating layer 30 may be disposed on the second insulating layer 20. The third insulating layer 30 may be a single-layered organic layer having a generally flat surface. In some exemplary embodiments, the third insulating layer 30 may include a plurality of color filters. A fourth insulating layer 40 may be disposed on the third insulating layer 30. The fourth insulating layer 40 may be an inorganic layer covering the color filters.

As shown in FIG. 3A, the pixel electrode PE may be disposed on the fourth insulating layer 40. The pixel electrode PE may be connected to the output electrode DE through the contact hole CH-L, which is formed to penetrate the second insulating layer 20, the third insulating layer 30, and the fourth insulating layer 40. An alignment layer may be formed on the fourth insulating layer 40 to cover the pixel electrode PE.

A second base substrate BS2 may be one of a glass substrate, a plastic substrate, and a substrate including a polyimide (PI). A black matrix layer BM may be disposed on a bottom surface of the second base substrate BS2. In other words, openings corresponding to pixel regions may be defined in the black matrix layer BM. A spacer CS may be overlapped with the black matrix layer BM.

Insulating layers may be disposed on the bottom surface of the second base substrate BS2 to cover the black matrix layer BM. FIG. 3A exemplarily illustrates a fifth insulating layer 50 having a generally flat surface. The fifth insulating layer 50 may be formed of or include an organic material.

The common electrode CE may be disposed on the bottom surface of the second base substrate BS2. A common voltage may be applied to the common electrode CE. The common voltage may have a value different from a pixel voltage.

FIG. 3A illustrates just one example of a section of the pixel PX. The first display substrate 100 and the second display substrate 200 may be inverted in the third direction DR3. The color filters may be disposed on the second display substrate 200.

A liquid crystal display panel, which is operated in a vertical alignment (VA) mode, may be exemplarily described with reference to FIG. 3A, but in some exemplary embodiments, a liquid crystal display panel may be operated in an in-plane switching (IPS) mode, or a fringe-field switching (FFS) mode, a plane-to-line switching (PLS) mode, a patterned vertical alignment (PVA) mode, a super vertical alignment (SVA) mode, a surface-stabilized vertical alignment (SS-VA) mode.

Referring to FIG. 3B, the graduated display layer of the display panel DP according to some exemplary embodiments may include an organic emission layer. In this case, the display panel DP may be an organic light emitting display panel.

The organic light emitting display panel may include a display substrate 100 and an encapsulation substrate 200. The display substrate 100 may include the first base substrate BS1, a circuit device layer DP-CL disposed on the first base substrate BS1, the display device layer DP-OLED disposed on the circuit device layer DP-CL, and a cover layer CL disposed on the display device layer DP-OLED. The encapsulation substrate 200 may include the second base substrate BS2 and the black matrix layer BM and a color control layer CCL, which are disposed on the second base substrate BS2.

The circuit device layer DP-CL may include a plurality of insulating layers, a semiconductor pattern, conductive patterns, signal lines, and so forth. An insulating layer, a semiconductor layer, and a conductive layer may be formed by a coating or deposition process. Thereafter, the insulating layer, the semiconductor layer, and the conductive layer may be selectively patterned using a photolithography process. Semiconductor patterns, conductive patterns, and signal lines constituting the circuit device layer DP-CL and the display device layer DP-OLED may be formed by this method.

The first base substrate BS1 may include a synthetic resin film. In some exemplary embodiments, the first base substrate BS1 may include a glass substrate, a metal substrate, or a substrate made of at least one of organic/inorganic composite materials.

A buffer layer BFL may be disposed on the first base substrate BS1. An adhesion strength between the first base substrate BS1 and the semiconductor pattern may be improved by the buffer layer BFL. The buffer layer BFL may include a silicon oxide layer and a silicon nitride layer. The silicon oxide layer and the silicon nitride layer may be alternatingly stacked.

A semiconductor pattern may be disposed on the buffer layer BFL. The semiconductor pattern may be formed of or include a polysilicon. However, the exemplary embodiments are not limited to this example, and the semiconductor pattern may include an amorphous silicon or a metal oxide.

The semiconductor pattern may include a doped region and an undoped region. The doped region may be doped with n- or p-type dopants. A p-type transistor may include a doped region, which is doped with p-type dopants.

The doped region may have electric conductivity that is higher than that of the undoped region and may serve as an electrode or a signal line. The undoped region may correspond to substantially an active or channel region of the transistor. In other words, a portion of the semiconductor pattern may be used as the active region of the transistor, another portion may be used as the source or drain electrode of the transistor, and other region may be used as a connection electrode or a connection signal line.

A transistor T1 may be disposed on the buffer layer BFL. A source electrode S1, an active region A1, and a drain region D1 of the transistor T1 may be formed from the semiconductor pattern. FIG. 3B illustrates a portion of a connection signal line SCL, which is formed from the semiconductor pattern. The connection signal line SCL may be connected to the drain electrode D1 of the transistor T1, when viewed in a plan view.

First to sixth insulating layers 10 to 60 may be disposed on the buffer layer BFL. Each of the first to sixth insulating layers 10 to 60 may be an inorganic or organic layer. A gate G1 may be disposed on the first insulating layer 10. An upper electrode UE may be disposed on the second insulating layer 20. A first connection electrode CNE1 may be disposed on the third insulating layer 30. The first connection electrode CNE1 may be coupled to the connection signal line SCL through a contact hole CNT-1 penetrating the first to third insulating layers 10 to 30. A second connection electrode CNE2 may be disposed on the fifth insulating layer 50. The second connection electrode CNE2 may be coupled to the first connection electrode CNE1 through a contact hole CNT-2 penetrating the fourth insulating layer 40 and the fifth insulating layer 50.

A light-emitting device OLED may be disposed on the sixth insulating layer 60. A first electrode AE may be disposed on the sixth insulating layer 60. The first electrode AE may be connected to the second connection electrode CNE2 through a contact hole CNT-3 penetrating the sixth insulating layer 60.

The display device layer DP-OLED may include the light-emitting device OLED and a pixel definition layer PDL. For example, the pixel definition layer PDL may be an organic layer. The light-emitting device OLED may include the first electrode AE, a hole control layer HCL, an emission layer EML, an electron control layer ECL, and a second electrode CE.

The pixel definition layer PDL may be disposed on the sixth insulating layer 60. An opening OP (hereinafter, a light-emitting opening) may be defined in the pixel definition layer PDL. The light-emitting opening OP may expose at least a portion of the first electrode AE. In some exemplary embodiments, the pixel definition layer PDL may have a black color. The pixel definition layer PDL may include a black coloring agent. In some exemplary embodiments, the pixel definition layer PDL may include a black dye or a black pigment mixed in a base resin.

FIG. 3B illustrates a light-emitting region PXA and a non-light-emitting region NPXA adjacent to the light-emitting region PXA. In some exemplary embodiments, the light-emitting region PXA may be defined to correspond to the first electrode AE exposed by the light-emitting opening OP.

The hole control layer HCL may be disposed in common on the light-emitting region PXA and the non-light-emitting region NPXA. The hole control layer HCL may include a hole transport layer and, in some exemplary embodiments, may further include a hole injection layer. The emission layer EML may be disposed on the hole control layer HCL. The emission layer EML may be disposed in a region corresponding to the light-emitting opening OP.

The electron control layer ECL may be disposed on the emission layer EML. The electron control layer ECL may include an electron transport layer and, in some exemplary embodiments, may further include an electron injection layer. The second electrode CE may be disposed on the electron control layer ECL.

The cover layer CL may be disposed on the second electrode CE. The cover layer CL may include a plurality of thin films. In some exemplary embodiments, the cover layer CL may include a capping layer and a thin encapsulation layer.

The second base substrate BS2 may be spaced apart from the cover layer CL. The second base substrate BS2 may be one of a glass substrate, a plastic substrate, and a substrate including a polyimide (PI).

The color control layer CCL may transmit a first color light or convert the first color light to a second or third color light, depending on the color of light provided by the light-emitting device OLED. The color control layer CCL may include quantum dots. Here, the first color light may be a blue light.

The black matrix layer BM may be overlapped with the non-light-emitting region NPXA. The black matrix layer BM may have a black color. The black matrix layer BM may include at least one of light absorbing materials, but the exemplary embodiments are not limited to a specific material of the black matrix layer BM.

Figure 4A:
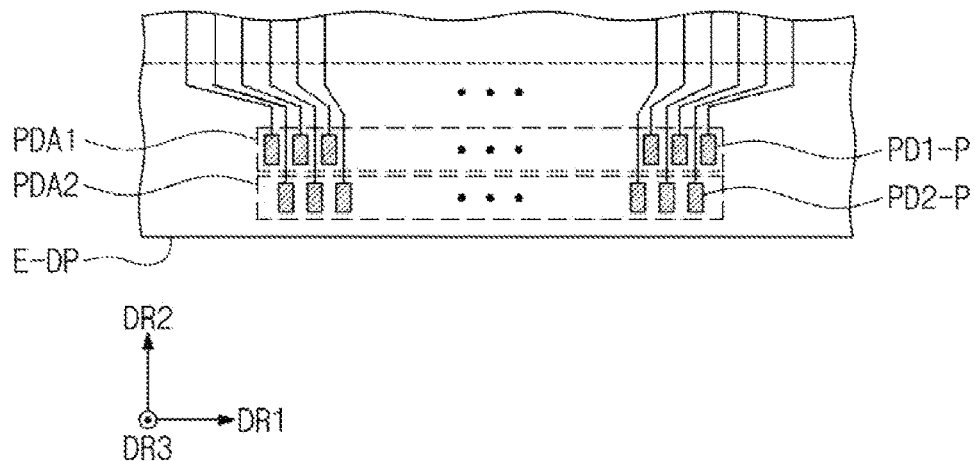
FIG. 4A is an enlarged plan view illustrating an exemplary embodiment of a portion of the display apparatus of FIG. 1.
Figure 4B:
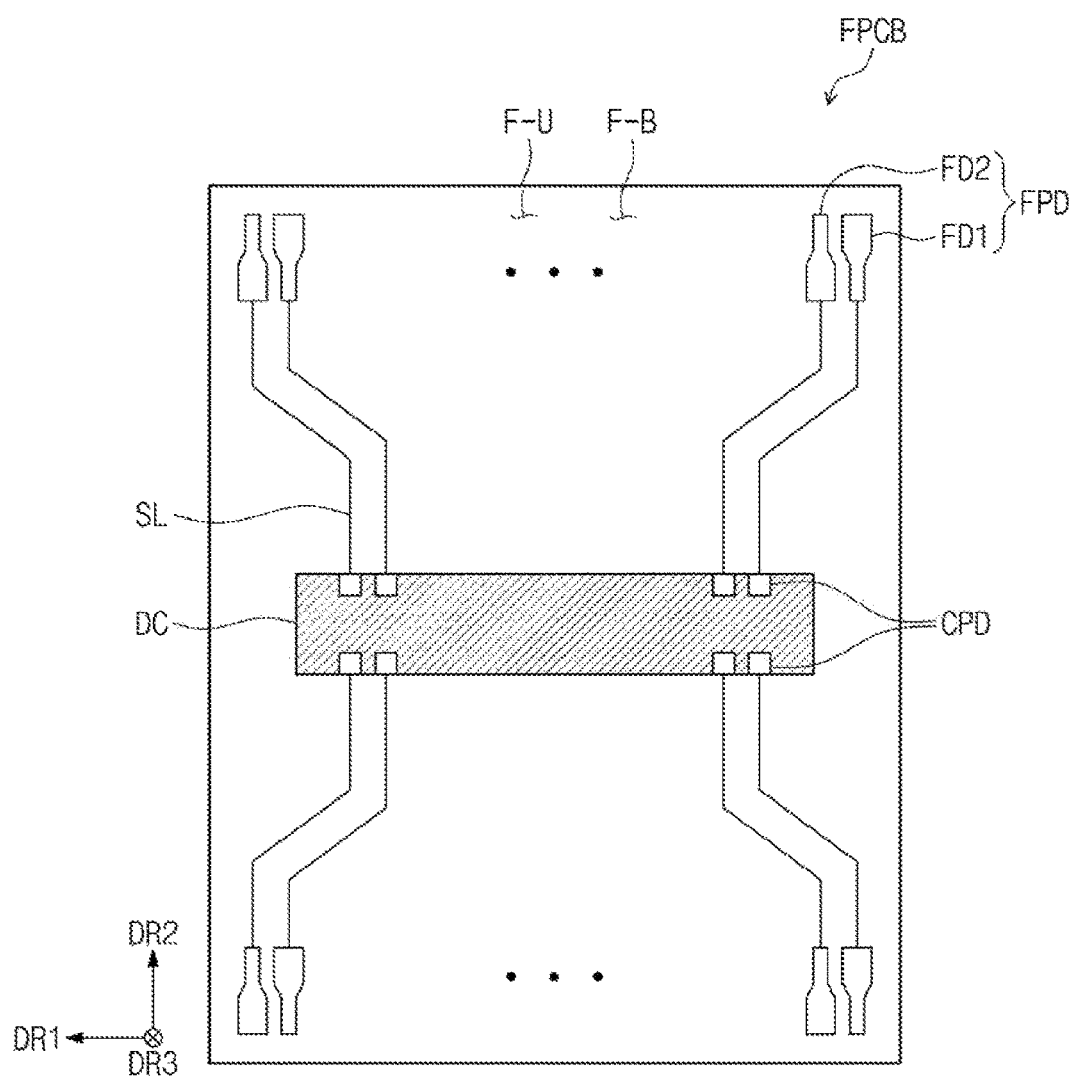
FIG. 4B is a rear view illustrating an exemplary embodiment of a flexible circuit board constructed according to principles of the invention.
Figure 4C:
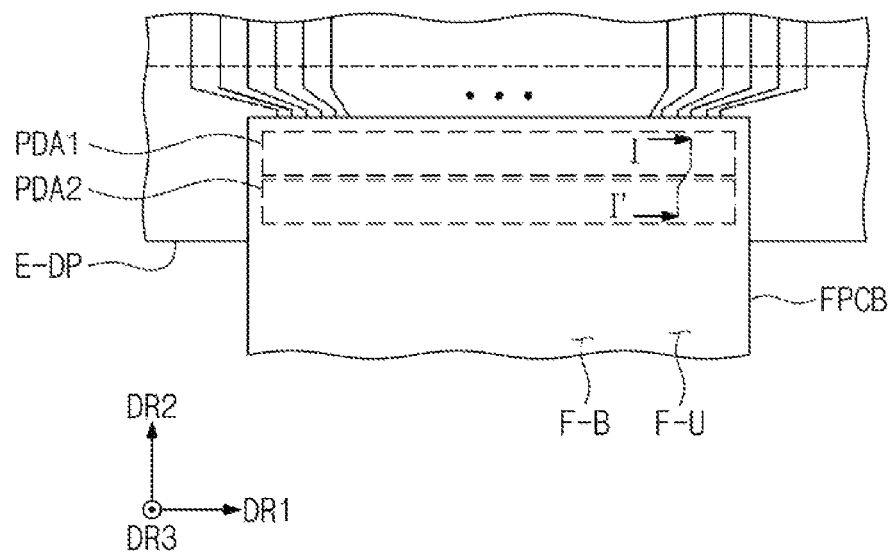
FIG. 4C is a plan view illustrating an exemplary embodiment of a coupled structure of a display panel and a flexible circuit board constructed according to principles of the invention.
Figure 4D:
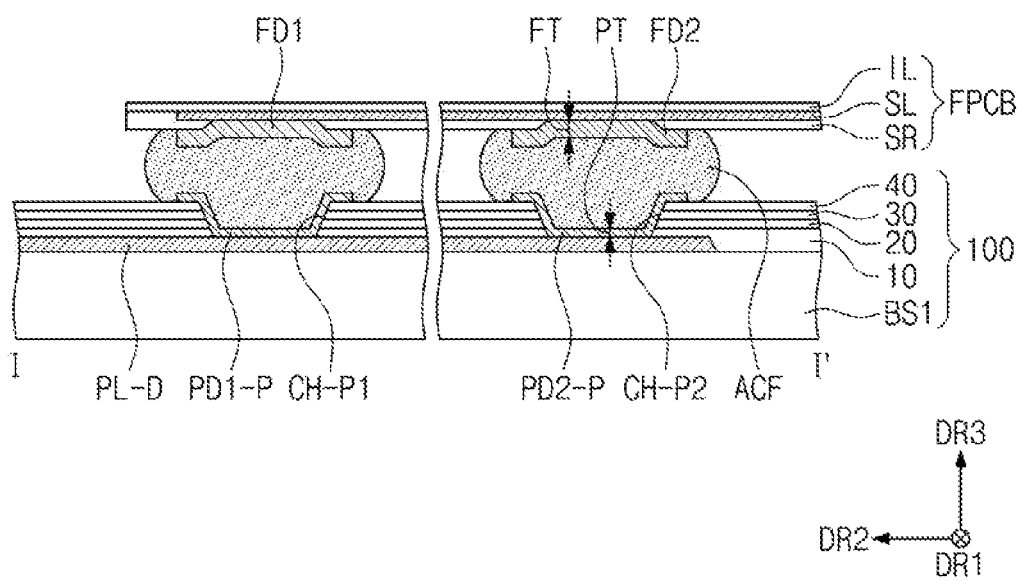
FIG. 4D is a cross-sectional view taken along a line I-I' of FIG. 4C.
Figure 5:
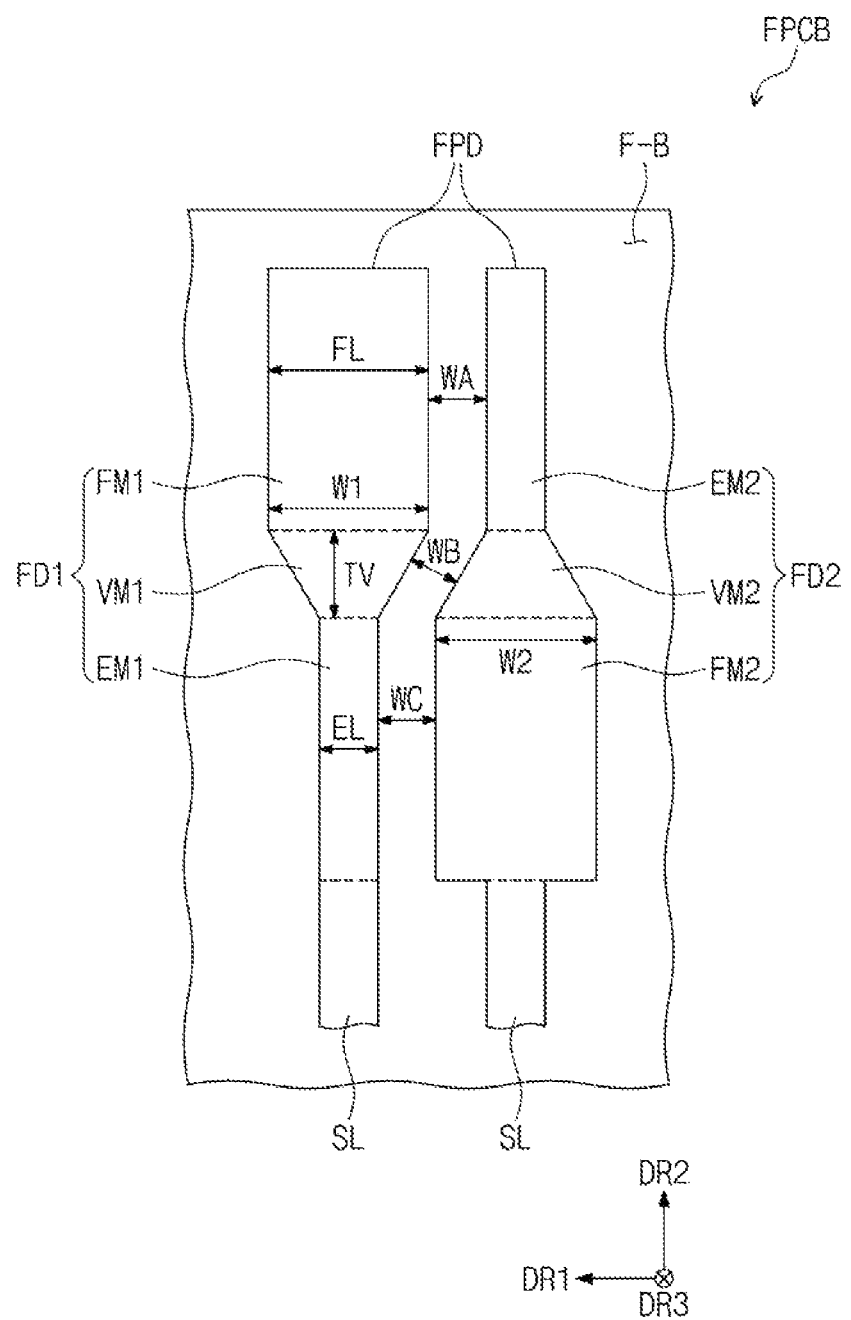
FIG. 5 is a rear view illustrating an exemplary embodiment of the flexible circuit board of FIG. 4B.

FIG. 4A is an enlarged plan view illustrating an exemplary embodiment of a portion of the display apparatus of FIG. 1. FIG. 4B is a rear view illustrating an exemplary embodiment of a flexible circuit board constructed according to principles of the invention. FIG. 4C is a plan view illustrating an exemplary embodiment of a coupled structure of a display panel and a flexible circuit board constructed according to principles of the invention. FIG. 4D is a cross-sectional view taken along a line I-I' of FIG. 4C. FIG. 5 is a rear view illustrating an exemplary embodiment of the flexible circuit board of FIG. 4B.

Referring to FIG. 4A, each of the display pad rows PDA1 and PDA2 may include a plurality of display pads arranged in the first direction DR1. The first display pad row PDA1 may be spaced apart from the second display pad row PDA2 in the second direction DR2 intersecting the first direction DR1. First display pads PD1-P of the first display pad row PDA1 and second display pads PD2-P of the second display pad row PDA2 may be disposed in an alternate manner. The pads of the first and second display pad rows PDA1 and PDA2 may be respectively connected to corresponding ones of the second auxiliary signal lines PL-D. The first display substrate 100 of FIGS. 4A and 4D is illustrated with reference to the liquid crystal display panel shown in FIG. 3A.

Referring to FIG. 4B, the flexible circuit board FPCB according to some exemplary embodiments may include a top surface F-U and a bottom surface F-B that are opposite to each other. The flexible circuit board FPCB may include board signal lines SL provided therein, the driving chip DC mounted on the flexible circuit board FPCB, and a board pad FPD exposed from the bottom surface F-B.

The board pad FPD may include first board pads FD1 and second board pads FD2 which are alternately disposed. The first board pad FD1 and the second board pad FD2 may be connected to coupling pads CPD through the board signal lines SL and may be coupled to the driving chip DC. A plurality of the first board pads FD1 and a plurality of the second board pads FD2 may be alternately disposed in the first direction DR1.

Referring to FIGS. 4C and 4D, corresponding ones of the board pads FD1 and FD2 of the flexible circuit board FPCB may be coupled to the display pad rows PDA1 and PDA2 of the display panel DP. For example, corresponding pairs of the display and board pads may be coupled to each other in such a way that the first display pad PD1-P of the first display pad row PDA1 is overlapped with and bonded to the first board pad FD1 and the second display pad PD2-P is overlapped with and bonded to the second board pad FD2.

In some exemplary embodiments, the display pads PD1-P and PD2-P may be connected to different auxiliary signal lines PL-D through contact holes CH-P1 and CH-P2 penetrating the first to fourth insulating layers 10 to 40. Each of the first and second display pads PD1-P and PD2-P may be exposed from the first to fourth insulating layers 10 to 40. However, the exemplary embodiments are not limited to this example, and in the case where the display pads PD1-P and PD2-P are omitted, an end portion of the auxiliary signal line PL-D may be exposed from the first to fourth insulating layers 10 to 40.

The flexible circuit board FPCB may include an insulating layer IL, the board signal line SL, a solder resist layer SR, and the board pads FD1 and FD2. Openings, each of which exposes at least a portion of the board signal line SL, may be defined in the solder resist layer SR. The first board pad FD1 and the second board pad FD2 may be connected to different ones of the board signal lines SL, which are exposed through the openings of the solder resist layer SR.

The display pads PD1-P and PD2-P may be electrically coupled to corresponding ones of the board pads FD1 and FD2 through the anisotropic conductive film ACF. The anisotropic conductive film ACF may be disposed between the display pads PD1-P and PD2-P and the board pads FD1 and FD2, and if a pressing process is performed, the display pads PD1-P and PD2-P may be bonded to the board pads FD1 and FD2 through the anisotropic conductive film ACF.

According to some exemplary embodiments, the thickness FT of the board pads FD1 and FD2 in the third direction DR3 may be larger than the thickness PT of the display pads PD1-P and PD2-P in the third direction DR3. The anisotropic conductive film ACF may suffer from various issues (e.g., a restricted flowability issue and a lump and consequent short-circuit issue), which may occur between adjacent ones of the pads PD1-P, PD2-P, FD1, and FD2 in the pressing process, depending on the thickness FT of the board pads FD1 and FD2.

FIG. 5 illustrates the board pad FPD and the board signal lines SL, which are some of the elements of the flexible circuit board FPCB and are disposed on the rear surface F-B, in an enlarged manner. In some exemplary embodiments, the board pad FPD may include the first board pad FD1 and the second board pad FD2. The first board pad FD1 and the second board pad FD2 may be spaced apart from each other in the first direction DR1.

The first board pad FD1 may include a first pad portion FM1 having a width W1, a first varying portion VM1, and a first extended portion EM1. The first varying portion VM1 may be disposed between the first pad portion FM1 and the first extended portion EM1. The first extended portion EM1 of the first board pad FD1 may be extended from the board signal line SL.

The second board pad FD2 may include a second pad portion FM2 having a width W2, a second varying portion VM2, and a second extended portion EM2. The second varying portion VM2 may be disposed between the second pad portion FM2 and the second extended portion EM2. The second pad portion FM2 of the second board pad FD2 may be extended from the board signal line SL.

In some exemplary embodiments, the first pad portion FM1 and the second pad portion FM2 may have substantially the same shape, the first varying portion VM1 and the second varying portion VM2 may have substantially the same shape, and the first extended portion EM1 and the second extended portion EM2 may have substantially the same shape.

In some exemplary embodiments, a first width FL of the first pad portion FM1 in the first direction DR1 may be larger than a second width EL of the first extended portion EM1. In addition, the width of the second pad portion FM2 in the first direction DR1 may be larger than the width of the second extended portion EM2.

In some exemplary embodiments, the width of each of the first and second varying portions VM1 and VM2 in the first direction DR1 may vary depending on position in the second direction DR2. For example, the width of the first varying portion VM1 may increase in the second direction DR2, and the width of the second varying portion VM2 may decrease in the second direction DR2.

In some exemplary embodiments, the width TV of each of the first and second varying portions VM1 and VM2 in the second direction DR2 may range from about 50 µm to about 500 µm. If the width TV of the first and second varying portions VM1 and VM2 in the second direction DR2 is less than about 50 µm, a distance between the first pad portion FM1 and the second pad portion FM2 may have a small value, and thus, a short failure may occur in a process of pressing the anisotropic conductive film. By contrast, if the width TV of the first and second varying portions VM1 and VM2 in the second direction DR2 is larger than about 500 µm, the distance between the first pad portion FM1 and the second pad portion FM2 may have a large value, and in this case, a large amount of the anisotropic conductive film may be required. In addition, the board pads and the display pads may be abnormally bonded to each other by the pressing process.

According to some exemplary embodiments, when viewed in the second direction DR2, the first pad portion FM1, the first varying portion VM1, and the first extended portion EM1 may be arranged in an order reversed from the arrangement order of the second pad portion FM2, the second varying portion VM2, and the second extended portion EM2. For example, if the first extended portion EM1, the first varying portion VM1, and the first pad portion FM1 of the first board pad FD1 are arranged in the second direction DR2 in enumerated order, the second pad portion FM2, the second varying portion VM2, and the second extended portion EM2 of the second board pad FD2 may be arranged in the second direction DR2 in enumerated order.

According to some exemplary embodiments, a first distance WA between the first pad portion FM1 and the second extended portion EM2, a second distance WB between the first varying portion VM1 and the second varying portion VM2, and a third distance WC between the second pad portion FM2 and the first extended portion EM1 may have substantially the same length. In other words, the first distance WA, the second distance WB, and the third distance WC may be substantially the same.

According to some exemplary embodiments, because the distance between the board pads FD1 and FD2 adjacent to each other is substantially uniform, anisotropic conductive film may flow effectively in a region between the pads PD1-P, PD2-P, FD1, and FD2 during a pressing process which is performed on the board pads FD1 and FD2 of the flexible circuit board FPCB and the display pads PD1-P and PD2-P of the display panel DP. Thus, it may be possible to prevent or suppress the anisotropic conductive film from being lumped in the region between the pads PD1-P, PD2-P, FD1, and FD2. Accordingly, connection characteristics between the flexible circuit board FPCB and the display panel DP may be improved, and the display apparatus DD may have improved reliability.

Figure 6:
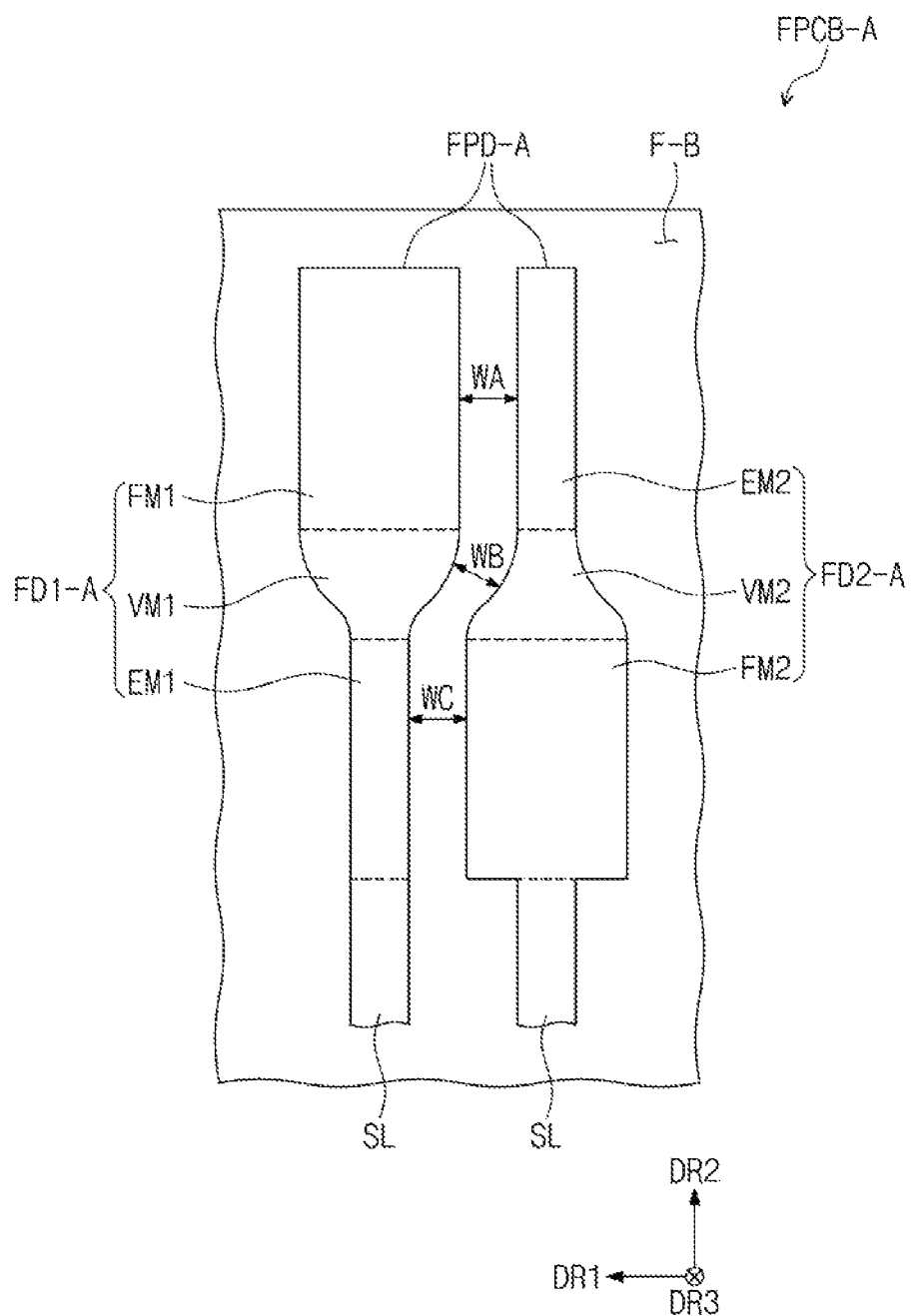
FIG. 6 is a rear view illustrating another exemplary embodiment of the flexible circuit board of FIG. 4B.

FIG. 6 is a rear view illustrating another exemplary embodiment of the flexible circuit board of FIG. 4B. For concise description, an element previously described with reference to FIGS. 1 to 5 may be identified by the same reference number without repeating an repetitive description thereof to avoid redundancy.

FIG. 6 illustrates a board pad FPD-A and the board signal lines SL, which are some elements constituting a flexible circuit board FPCB-A, in an enlarged manner. In some exemplary embodiments, the board pad FPD-A may include a first board pad FD1-A and a second board pad FD2-A. The first board pad FD1-A and the second board pad FD2-A may be spaced apart from each other in the first direction DR1.

The first board pad FD1-A may include the first pad portion FM1, the first varying portion VM1, and the first extended portion EM1. The first varying portion VM1 may be disposed between the first pad portion FM1 and the first extended portion EM1. The first extended portion EM1 of the first board pad FD1-A may be extended from the board signal line SL.

The second board pad FD2-A may include the second pad portion FM2, the second varying portion VM2, and the second extended portion EM2. The second varying portion VM2 may be disposed between the second pad portion FM2 and the second extended portion EM2. The second pad portion FM2 of the second board pad FD2-A may be extended from the board signal line SL.

In some exemplary embodiments, the width of each of the first and second varying portions VM1 and VM2 in the first direction DR1 may vary depending on position in the second direction DR2. For example, the width of the first varying portion VM1 may increase with increasing distance in the second direction DR2, and the width of the second varying portion VM2 may decrease with increasing distance in the second direction DR2.

In some exemplary embodiments, the first pad portion FM1 and the second pad portion FM2 may have substantially the same shape, and the first extended portion EM1 and the second extended portion EM2 may have substantially the same shape. The first and second varying portions VM1 and VM2 may have different shapes from each other. For example, the first varying portion VM1 may have a generally convex shape. The second varying portion VM2 may have a generally concave shape whose general curvature matches the generally convex shape of the first varying portion VM1.

Thus, even when the first and second varying portions VM1 and VM2 have different shapes, the first distance WA between the first pad portion FM1 and the second extended portion EM2, the second distance WB between the first varying portion VM1 and the second varying portion VM2, and the third distance WC between the second pad portion FM2 and the first extended portion EM1 may be maintained to substantially the same value.

Figure 7:
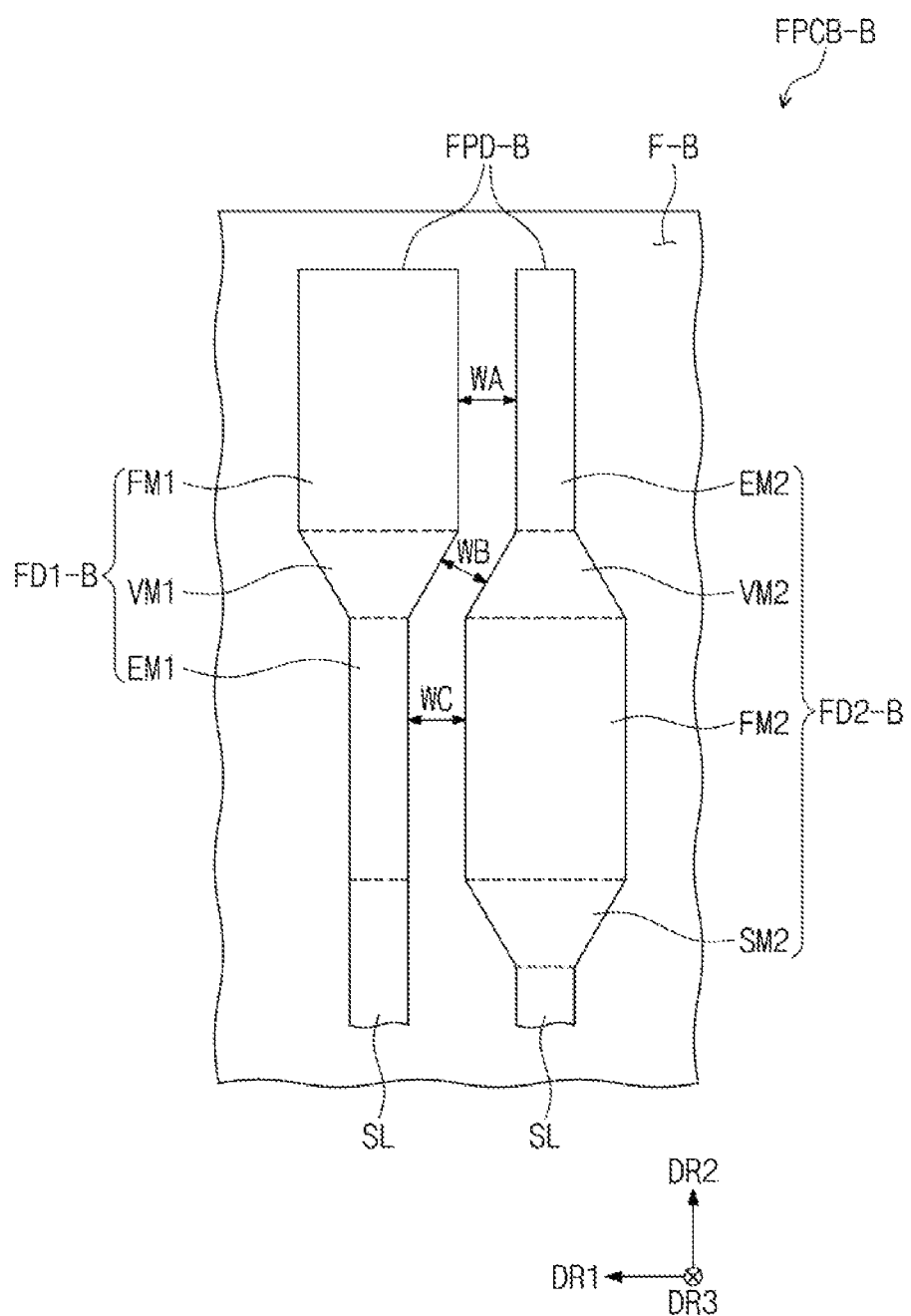
FIG. 7 is a rear view illustrating a further exemplary embodiment of the flexible circuit board.

FIG. 7 is a rear view illustrating a further exemplary embodiment of the flexible circuit board. For concise description, an element previously described with reference to FIGS. 1 to 5 may be identified by the same reference number without repeating a repetitive description thereof to avoid redundancy.

FIG. 7 illustrates a board pad FPD-B and the board signal lines SL, which are some elements constituting a flexible circuit board FPCB-B, in an enlarged manner. In some exemplary embodiments, the board pad FPD-B may include a first board pad FD1-B and a second board pad FD2-B. The first board pad FD1-B and the second board pad FD2-B may be spaced apart from each other in the first direction DR1.

The first board pad FD1-B may include the first pad portion FM1, the first varying portion VM1, and the first extended portion EM1. The first varying portion VM1 may be disposed between the first pad portion FM1 and the first extended portion EM1. The first extended portion EM1 of the first board pad FD1-B may be extended from the board signal line SL.

The second board pad FD2-B may include the second pad portion FM2, the second varying portion VM2, the second extended portion EM2, and an additional extended portion SM2. The second varying portion VM2 may be disposed between the second pad portion FM2 and the second extended portion EM2. The additional extended portion SM2 may be disposed between the second pad portion FM2 and the board signal line SL. For example, the additional extended portion SM2 may be extended from the board signal line SL.

In some exemplary embodiments, the width of each of the first and second varying portions VM1 and VM2 in the first direction DR1 may vary depending on position in the second direction DR2. For example, the width of the first varying portion VM1 may increase with increasing distance in the second direction DR2, and the width of the second varying portion VM2 may decrease with increasing distance in the second direction DR2.

In some exemplary embodiments, the width of the additional extended portion SM2 in the first direction DR1 may vary depending on position in the second direction DR2. For example, the width of the additional extended portion SM2 may increase with increasing distance in the second direction DR2. Thus, the distance between the second pad portion FM2 and the board signal line SL, which is connected to the first board pad FD1-B, and the distance between the board signal lines SL may gradually increase.

According to some exemplary embodiments, the first distance WA between the first pad portion FM1 and the second extended portion EM2, the second distance WB between the first varying portion VM1 and the second varying portion VM2, and the third distance WC between the second pad portion FM2 and the first extended portion EM1 may have substantially the same length. In other words, the first distance WA, the second distance WB, and the third distance WC may be substantially the same. According to some exemplary embodiments, since the additional extended portion SM2 is provided, it may be possible to improve flowability of the anisotropic conductive film in the process of pressing the anisotropic conductive film.

Figure 8:
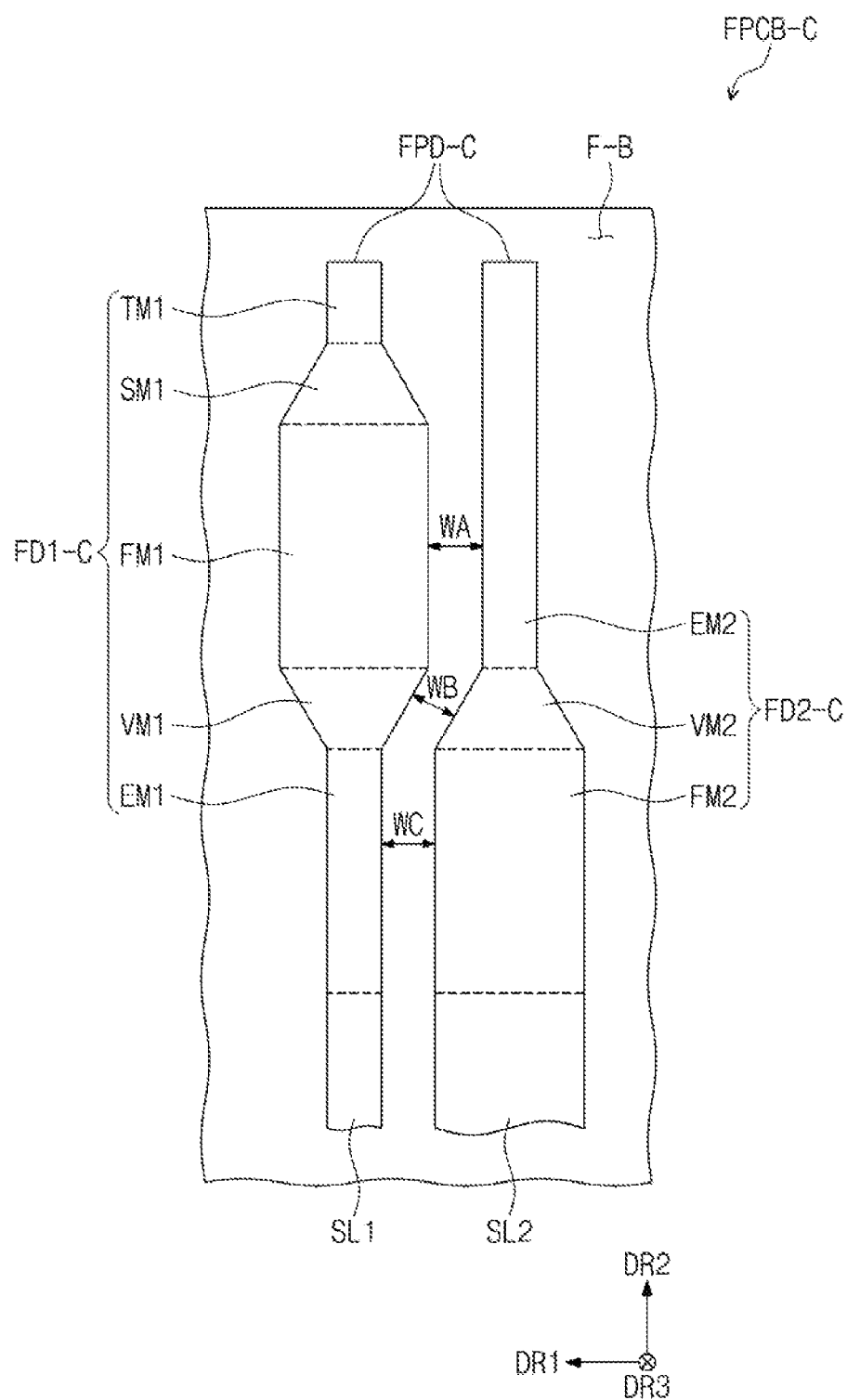
FIG. 8 is a rear view illustrating yet another exemplary embodiment of the flexible circuit board.
Figure 9:
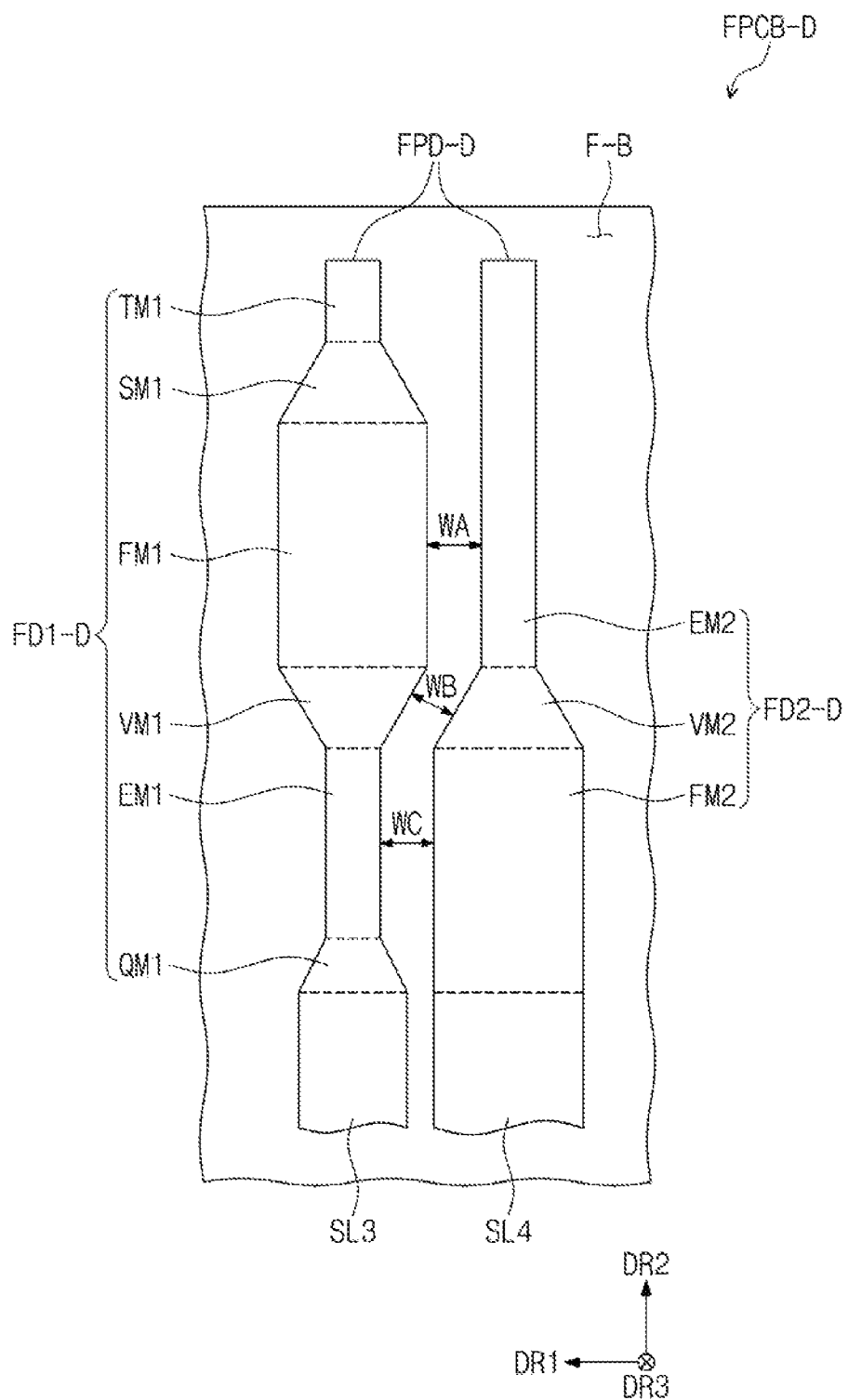
FIG. 9 is a rear view illustrating still another exemplary embodiment of the flexible circuit board.
Figure 10:
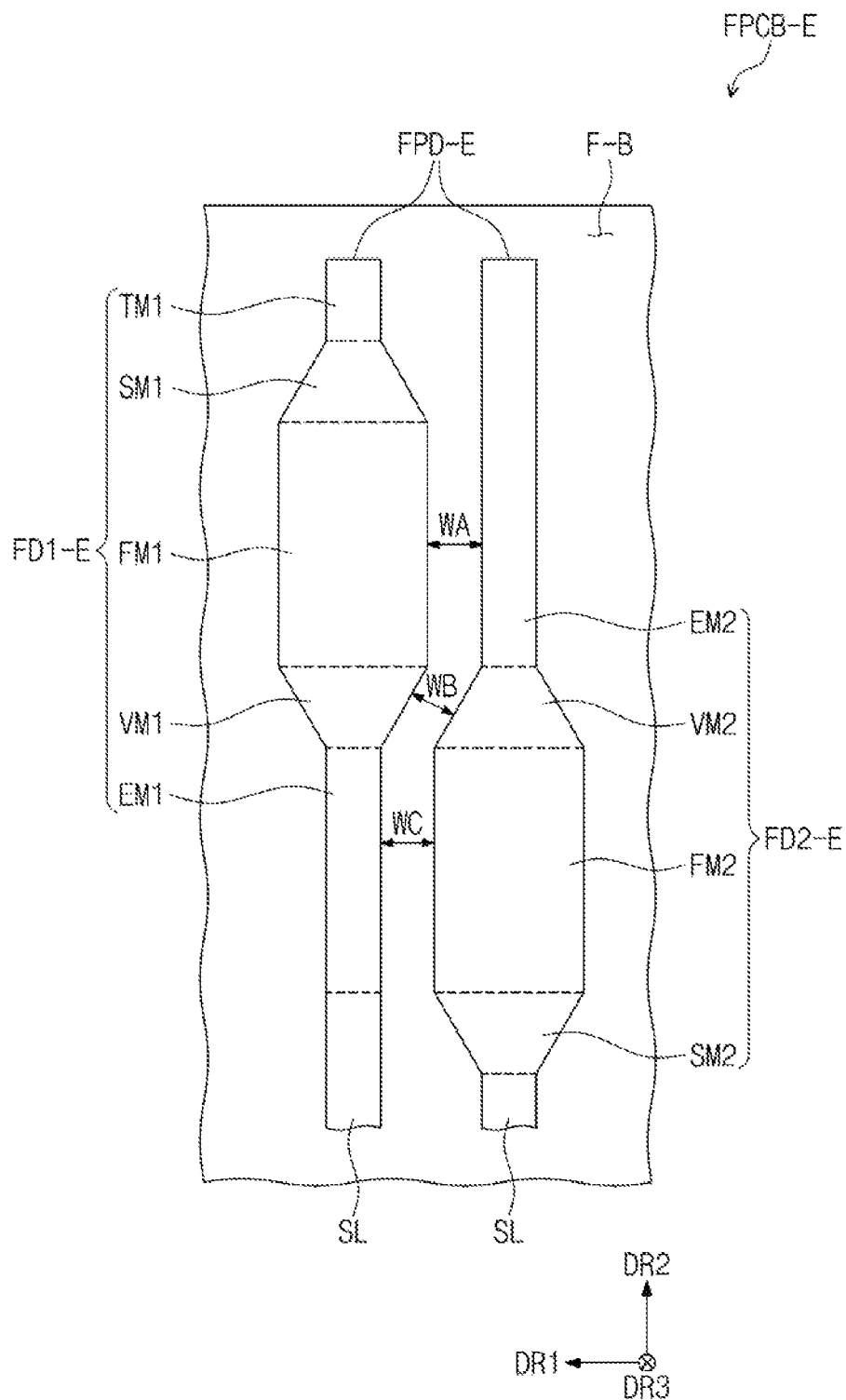
FIG. 10 is a rear view illustrating a still further exemplary embodiment of the flexible circuit board.

FIG. 8 is a rear view illustrating yet another exemplary embodiment of the flexible circuit board. FIG. 9 is a rear view illustrating still another exemplary embodiment of the flexible circuit board. FIG. 10 is a rear view illustrating a still further exemplary embodiment of the flexible circuit board. For concise description, an element previously described with reference to FIGS. 1 to 5 may be identified by the same reference number without repeating a repetitive description thereof to avoid redundancy.

FIG. 8 illustrates a board pad FPD-C and board signal lines SL1 and SL2, which is are some elements constituting a flexible circuit board FPCB-C and are disposed on the rear surface F-B, in an enlarged manner. The board signal lines SL1 and SL2 may include a first signal line SL1 connected to a first board pad FD1-C and a second signal line SL2 connected to a second board pad FD2-C.

In some exemplary embodiments, the board pad FPD-C may include the first board pad FD1-C and the second board pad FD2-C. The first board pad FD1-C and the second board pad FD2-C may be spaced apart from each other in the first direction DR1.

The first board pad FD1-C may include the first pad portion FM1, the first varying portion VM1, and the first extended portion EM1. In some exemplary embodiments, the first board pad FD1-C may further include an additional varying portion SM1 and a sub-extended portion TM1.

The first varying portion VM1 may be disposed between the first pad portion FM1 and the first extended portion EM1. The width of the first varying portion VM1 in the first direction DR1 may increase with increasing distance in the second direction DR2. The additional varying portion SM1 may be disposed between the first pad portion FM1 and the sub-extended portion TM1. The width of the additional varying portion SM1 in the first direction DR1 may decrease with increasing distance in the second direction DR2. The first extended portion EM1 may be extended from the first signal line SL1.

The second board pad FD2-C may include the second pad portion FM2, the second varying portion VM2, and the second extended portion EM2. The second varying portion VM2 may be disposed between the second pad portion FM2 and the second extended portion EM2. the width of the second varying portion VM2 in the first direction DR1 may decrease with increasing distance in the second direction DR2. The second pad portion FM2 may be extended from the second signal line SL2.

According to some exemplary embodiments, the first distance WA between the first pad portion FM1 and the second extended portion EM2, the second distance WB between the first varying portion VM1 and the second varying portion VM2, and the third distance WC between the second pad portion FM2 and the first extended portion EM1 may substantially the same length. In other words, the first distance WA, the second distance WB, and the third distance WC may be substantially the same.

In some exemplary embodiments, the width of the sub-extended portion TM1 in the first direction DR1 may be substantially equal to the width of the first signal line SL1 in the first direction DR1. The width of the second pad portion FM2 in the first direction DR1 may be substantially equal to the width of the second signal line SL2 in the first direction DR1.

In some exemplary embodiments, the width of the first signal line SL1 in the first direction DR1 may be smaller than the width of the second signal line SL2 in the first direction DR1. According to some exemplary embodiments, since the sub-extended portion TM1 is provided, it may be possible to improve flowability of the anisotropic conductive film in the process of pressing the anisotropic conductive film.

FIG. 9 illustrates a board pad FPD-D and board signal lines SL3 and SL4, which are some elements constituting a flexible circuit board FPCB-D and are disposed on the rear surface F-B, in an enlarged manner. The board signal lines SL3 and SL4 may include a first signal line SL3 connected to a first board pad FD1-D and a second signal line SL4 connected to a second board pad FD2-D.

In some exemplary embodiments, the board pad FPD-D may include the first board pad FD1-D and the second board pad FD2-D. The first board pad FD1-D and the second board pad FD2-D may be spaced apart from each other in the first direction DR1.

The first board pad FD1-D may include the first pad portion FM1, the first varying portion VM1, and the first extended portion EM1. In some exemplary embodiments, the first board pad FD1-D may further include the additional varying portion SM1, the sub-extended portion TM1 and a line varying portion QM1.

The first varying portion VM1 may be disposed between the first pad portion FM1 and the first extended portion EM1. The width of the first varying portion VM1 in the first direction DR1 may increase with increasing distance in the second direction DR2. The additional varying portion SM1 may be disposed between the first pad portion FM1 and the sub-extended portion TM1. The width of the additional varying portion SM1 in the first direction DR1 may decrease with increasing distance in the second direction DR2.

The line varying portion QM1 may be disposed between the first extended portion EM1 and the first signal line SL3. The width of the line varying portion QM1 in the first direction DR1 may decrease with increasing distance in the second direction DR2. The smallest width of the line varying portion QM1 in the first direction may be substantially equal to the smallest width of the first varying portion VM1 in the first direction. The largest width of the line varying portion QM1 in the first direction may be smaller than the largest width of the first varying portion VM1 in the first direction. An end of the line varying portion QM1 may be extended from the first signal line SL3. In some exemplary embodiments, the width of the first signal line SL3 in the first direction DR1 may be substantially equal to the largest width of the line varying portion QM1 in the first direction.

The second board pad FD2-D may include the second pad portion FM2, the second varying portion VM2, and the second extended portion EM2. The second varying portion VM2 may be disposed between the second pad portion FM2 and the second extended portion EM2. The width of the second varying portion VM2 in the first direction DR1 may decrease with increasing distance in the second direction DR2. The second pad portion FM2 may be extended from the second signal line SL2. In some exemplary embodiments, the width of the first signal line SL3 in the first direction DR1 may be smaller than the width of the second signal line SL4 in the first direction DR1.

According to some exemplary embodiments, the first distance WA between the first pad portion FM1 and the second extended portion EM2, the second distance WB between the first varying portion VM1 and the second varying portion VM2, and the third distance WC between the second pad portion FM2 and the first extended portion EM1 may substantially the same length. In other words, the first distance WA, the second distance WB, and the third distance WC may be substantially the same.

FIG. 10 illustrates a board pad FPD-E and the board signal lines SL, which are some elements constituting a flexible circuit board FPCB-E and are disposed on the rear surface F-B, in an enlarged manner. The board signal lines SL may be connected to corresponding ones of the first board pad FD1-E and the second board pad FD2-E.

In some exemplary embodiments, the board pad FPD-E may include a first board pad FD1-E and a second board pad FD2-E. The first board pad FD1-E and the second board pad FD2-E may be spaced apart from each other in the first direction DR1.

The first board pad FD1-E may include the first pad portion FM1, the first varying portion VM1, and the first extended portion EM1. In some exemplary embodiments, the first board pad FD1-E may further include the additional varying portion SM1 and the sub-extended portion TM1.

The first varying portion VM1 may be disposed between the first pad portion FM1 and the first extended portion EM1. The width of the first varying portion VM1 in the first direction DR1 may increase with increasing distance in the second direction DR2. The additional varying portion SM1 may be disposed between the first pad portion FM1 and the sub-extended portion TM1. The width of the additional varying portion SM1 in the first direction DR1 may decrease with increasing distance in the second direction DR2. The first extended portion EM1 may be extended from the first signal line SL1.

The second board pad FD2-E may include the second pad portion FM2, the second varying portion VM2, and the second extended portion EM2. In some exemplary embodiments, the second board pad FD2-E may further include an additional varying portion SM2. The second varying portion VM2 may be disposed between the second pad portion FM2 and the second extended portion EM2. The width of the second varying portion VM2 in the first direction DR1 may decrease with increasing distance in the second direction DR2. The second pad portion FM2 may be extended from the second signal line SL2. The additional varying portion SM2 may be disposed between the second pad portion FM2 and the board signal line SL. The width of the additional varying portion SM2 in the first direction DR1 may increase with increasing distance in the second direction DR2. An end of the additional varying portion SM2 may be extended from the board signal line SL.

According to some exemplary embodiments, the first distance WA between the first pad portion FM1 and the second extended portion EM2, the second distance WB between the first varying portion VM1 and the second varying portion VM2, and the third distance WC between the second pad portion FM2 and the first extended portion EM1 may substantially the same length. In other words, the first distance WA, the second distance WB, and the third distance WC may be substantially the same.

In some exemplary embodiments, the width, in the first direction DR1, between the first extended portion EM1 and the second board pad FD2-E may increase in a direction from the second pad portion FM2 toward the additional varying portion SM2. According to some exemplary embodiments, since the additional varying portion SM2 is provided, it may be possible to improve flowability of the anisotropic conductive film in the process of pressing the anisotropic conductive film.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus, comprising:
a flexible circuit board including a first board pad and a second board pad, which are spaced apart from each other in a first direction and extend in a second direction intersecting the first direction;
a main circuit board coupled to the flexible circuit board; and
a display panel coupled to the flexible circuit board, the display panel including a first display pad overlapped with the first board pad and a second display pad overlapped with the second board pad,
wherein the first board pad comprises a first portion, a second portion, and a third portion, with the third portion being disposed between the first and second portions,
the second board pad comprises a first portion, a second portion, and a third portion, with the third portion being disposed between the first and the second portions,
the third portion of the first board pad having a width in the first direction that increases with increasing distance in the second direction, and
the third portion of the second board pad having a width in the first direction that decreases with increasing distance in the second direction,
wherein each of the third portions has a width in the second direction ranging from about 50 μm to about 500 μm.

2. The display apparatus of claim 1, wherein the first portion, the second portion, and the third portion of the first board pad arranged in an order reversed from an arrangement order of the first portion, the second portion, and the third portion of the second board pad, when viewed in the second direction.

3. The display apparatus of claim 1, wherein the first portion of the first board pad has a width in the first direction larger than a width of the second portion of the first board pad, and
the first portion of the second board pad has a width in the first direction larger than a width of the second portion of the second board pad.

4. The display apparatus of claim 1, wherein a distance between the first portion of the first board pad and the second portion of the second board pad, a distance between the third portion of the first board pad and the third portion of the second board pad, and a distance between the second portion of the first board pad and the first portion of the second board pad are substantially the same.

5. The display apparatus of claim 1, wherein the portion of the first board pad and a first portion of the second board pad have substantially the same shape,
the third portion of the first board pad and the third portion of the second board pad have substantially the same shape, and the second portion of the first board pad and the second portion of the second board pad have substantially the same shape.

6. The display apparatus of claim 1, wherein the third portion of the first board pad has a generally convex shape, and
the third portion of the second board pad has a generally concave shape.

7. The display apparatus of claim 1, wherein the second board pad further comprises a fourth portion, which is spaced apart from the third portion of the second board pad with the first portion of the second board pad interposed therebetween.

8. The display apparatus of claim 7, wherein the third portion of the second board pad has a generally concave shape, and wherein the fourth portion of the second board pad has a generally convex shape.

9. The display apparatus of claim 1, wherein the flexible circuit board comprises an insulating layer, a plurality of board signal lines disposed on the insulating layer, and a solder resist layer, in which openings partially exposing the board signal lines are defined,
the second portion of the first board pad extends from a corresponding one of the board signal lines, and
the first portion of the second board pad extends from a corresponding another one of the board signal lines.

10. The display apparatus of claim 1, wherein the first board pad and the second board pad are coupled to the first display pad and the second display pad by an anisotropic conductive film.

11. The display apparatus of claim 1, wherein the first board pad has a thickness in a thickness direction of the display panel larger than a thickness of the first display pad, and
the second board pad has a thickness of in the thickness direction of the display panel larger than a thickness of the second display pad.

12. A flexible circuit board for a display apparatus, the flexible circuit board comprising:
a first board pad and a second board pad, which are spaced apart from each other in a first direction to be and are extended in a second direction intersecting the first direction,
wherein
the first board pad comprises a first pad portion, a first extended portion, and a first varying portion disposed between the first pad portion and the first extended portion,
the second board pad comprises a second pad portion, a second extended portion, and a second varying portion disposed between the second pad portion and the second extended portion, and
the first pad portion, the first varying portion, and the first extended portion are disposed in an order reversed from an arrangement order of the second pad portion, the second varying portion, and the second extended portion, when viewed in the second direction,
wherein each of the third portions has a width in the second direction ranging from about 50 μm to about 500 μm.

13. The flexible circuit board of claim 12, wherein a distance between the first pad portion and the second extended portion, a distance between the first varying portion and the second varying portion, and a distance between the first extended portion and the second pad portion are substantially the same.

14. The flexible circuit board of claim 13, wherein the first pad portion and the second pad portion have substantially the same shape,
the first varying portion and the second varying portion have substantially the same shape, and
the first extended portion and the second extended portion have substantially the same shape.

15. The flexible circuit board of claim 13, wherein the first varying portion has a generally convex shape, and the second varying portion has a generally concave shape.

16. The flexible circuit board of claim 13, wherein the second board pad further comprises an additional varying portion, which is spaced apart from the second varying portion with the second pad portion interposed therebetween.

17. The flexible circuit board of claim 12, wherein the first pad portion has a width in the first direction larger than a width of the first extended portion, and
the second pad portion has a width in the first direction larger than a width of the second extended portion.

18. The flexible circuit board of claim 17, wherein the first varying portion has a width of in the first direction that increases with increasing distance in the second direction, and
the second varying portion has a width in the first direction that decreases with increasing distance in the second direction.

19. The flexible circuit board of claim 12, wherein the flexible circuit board comprises an insulating layer, a plurality of board signal lines disposed on the insulating layer, and a solder resist layer, in which openings partially exposing the board signal lines are defined, and the first board pad and the second board pad are coupled to corresponding ones of the board signal lines through the openings.

* * * * *